United States Patent [19]

Neuhaus et al.

[11] Patent Number: 5,394,419
[45] Date of Patent: Feb. 28, 1995

[54] CIRCUIT ARRANGEMENT FOR LIMITING THE POWER OF THE OPTICAL SIGNAL EMITTED BY A LASER DIODE

[75] Inventors: Klaus Neuhaus, München; Klaus Panzer, Regensburg; Michael Stockmann, Bruckmühl, all of Germany

[73] Assignee: Siemens Aktiengesellschaft, Munich, Germany

[21] Appl. No.: 185,797
[22] PCT Filed: May 25, 1992
[86] PCT No.: PCT/EP92/01435
§ 371 Date: Jan. 21, 1994
§ 102(e) Date: Jan. 21, 1994
[87] PCT Pub. No.: WO93/02493
PCT Pub. Date: Feb. 4, 1993

[30] Foreign Application Priority Data

Jul. 24, 1991 [DE] Germany ............ 91112451

[51] Int. Cl.⁶ .................................. H01S 3/00
[52] U.S. Cl. .................................. 372/38; 372/29
[58] Field of Search .................. 372/38, 29

[56] References Cited

U.S. PATENT DOCUMENTS 5,038,189  8/1991  Fukudome ............... 372/38
5,297,157  3/1994  Kaiser et al. ........... 372/38

FOREIGN PATENT DOCUMENTS 0385470   9/1990  European Pat. Off. .
3614691  11/1987  Germany .
57-10279  1/1982  Japan .
57-54382  3/1982  Japan .
59-55083  3/1984  Japan .
3060087   3/1991  Japan .

*Primary Examiner*—Georgia Y. Epps
*Attorney, Agent, or Firm*—Hill, Steadman & Simpson

[57] ABSTRACT

In a circuit arrangement for limiting the power of the optical signal emitted by a laser, the current through the laser is supplied via a parallel connection of a plurality of series circuits of a transistor with a resistor. In addition, provision is made for a limitation, depending on the operating temperature of the laser, of the maximum current through the laser, which is realized by means of a temperature-dependent control signal fed to the control electrodes of the transistors.

7 Claims, 2 Drawing Sheets

CIRCUIT ARRANGEMENT FOR LIMITING THE POWER OF THE OPTICAL SIGNAL EMITTED BY A LASER DIODE

BACKGROUND OF THE INVENTION

1. Field of the Invention

The invention relates to a circuit arrangement for limiting the power of the optical signal emitted by a laser, in which an operating voltage source, a laser diode and the parallel connection of a plurality of series circuits of a resistor with the main electrodes of a transistor form a circuit, and in which the same drive signal is applied at least indirectly to the control electrodes of all the transistors.

2. Description of the Related Art

Patent Abstracts of Japan disclose in the publication No. JP 570 10 279 a circuit arrangement in which an operating voltage source, a laser diode and the parallel connection of a plurality of series circuits of a resistor with the main electrodes of a transistor form a circuit. In this circuit arrangement, the same drive signal is applied to the control electrodes of all the transistors. In accordance with the document, this circuit arrangement solves the problem of a reduced power input with respect to a circuit arrangement having only one transistor. No information can be discerned on limiting the power of the optical signal output by a laser in the event of a fault.

For the purpose of transmitting messages, increasing use is being made in telecommunications engineering of glass fiber transmission systems in which message signals present as electric signals are converted with the aid of a laser into optical signals which are fed via an optical fiber to a receiving device where they are reconverted into electric signals.

A risk associated with the operation of such a transmission system comes where there is a breakage of the transmission link, which can result in the optical signal emerges from the optical fiber causing injury to the human eye. The maximum permissible irradiation (MPI) for the cornea according to the current regulations is reached an optical signal with a wavelength of 1,300 nm and an optical power of 3 mW when the emitting face of the single mode fiber from which the optical signal emerges is at a distance of 10 mm from the cornea. In the normal case, the transmission link is operated at power values of the optical signal lower than those specified above, with the result that no danger occurs in the event of breakage of the transmission link; in the event of a fault, however, power values which exceed the permissible limit value can occur in the optical signal.

In assessing a drive circuit for a laser, with respect to safeguarding against overshooting of the maximum permissible power of the optical signal, it is assumed that each component of the drive circuit can fail in such a way that the optical power output by the laser reaches a maximum value; only in the case of resistors is it assumed that a component failure always leads to an increase in resistance.

Circuits have become known in which the current through the laser diode is limited by a series circuit of a resistor with the main electrodes of a transistor. In such a circuit, the current is set by the laser diode via the control electrode of the transistor. A failure to be assumed taking account of the foregoing considerations consists in a short circuit of the main electrodes of the transistor, the resistance limiting the current through the laser diode and thus the power of the optical signal output by the laser diode. However, to achieve a prescribed power value of the optical signal emitted by the laser diode after aging of the laser diode and/or for operation of an uncooled laser diode at an increased operating temperature it is necessary to permit current values which in the case of a new laser diode and/or of operation at a lower operating temperature of the laser diode.

Another possibility for satisfying the maximum permissible irradiation (MPI) consists in lowering the coupling efficiency between the laser and the optical fiber to such an extent that the limit value for the maximum permissible irradiation upon breakage of the optical fiber is satisfied in the case of the maximum optical power output by the laser in the event of a fault. However, this measure contradicts the efforts to obtain a coupling efficiency between the laser and the optical fiber which is as high as possible.

It is known for transmission systems in which optical signals are transmitted bidirectionally via a single optical fiber to switch on a laser only if an optical signal has been received from the remote station; in the case of reception of an optical signal, it is assumed that the transmission link is fault-free. In addition to the limitation to bidirectional transmission systems which is occasioned by the principle, this outlay on circuitry and control required for its implementation is an evident disadvantage in the case of this measure.

SUMMARY OF THE INVENTION

The present invention solves the problem of providing a drive circuit for a laser diode which, on the one hand, is capable of supplying an adequate current for the laser diode within a prescribed operating temperature range of the laser diode and for an increased current requirement with advancing age of the laser diode and, on the other hand, in the event of failure of an arbitrary component of the circuit arrangement, is capable of limiting the power of the optical signal emitted by the laser diode below a prescribed limit value.

The problem is solved by the circuit arrangement of the type outlined at the beginning of this specification in such a way that a drive signal influenced in accordance with the temperature of the laser diode is applied to the predominant number of the transistors directly at their control electrodes, and the drive signal for higher temperature values of the laser diode, which is influenced in accordance with the temperature of the laser diode, effects a higher current through the laser diode.

In addition to the advantage of realizing with a low outlay a laser diode drive circuit which, on the one hand, has an adequate capacity to supply current for an increased current requirement with increasing aging of the laser diode and in the prescribed operating temperature range of the laser diode and, on the other hand, in the event of an arbitrary component failure of the drive circuit limits the power of the optical signal emitted by the laser diode below a prescribed limit value, the invention provides the further advantage that, due to the distribution of the current feeding the laser diode over a plurality of transistors, each transistor must carry and disconnect a correspondingly reduced current, the shortened time requirement for disconnecting a reduced current being available for increasing the operating frequency of the circuit arrangement.

BRIEF DESCRIPTION OF THE DRAWINGS

To the extent required for it to be understood, the invention is described in more detail with the aid of figures as an exemplary embodiment.

DETAILED DESCRIPTION OF THE PREFERRED EMBODIMENTS

Figure 1:
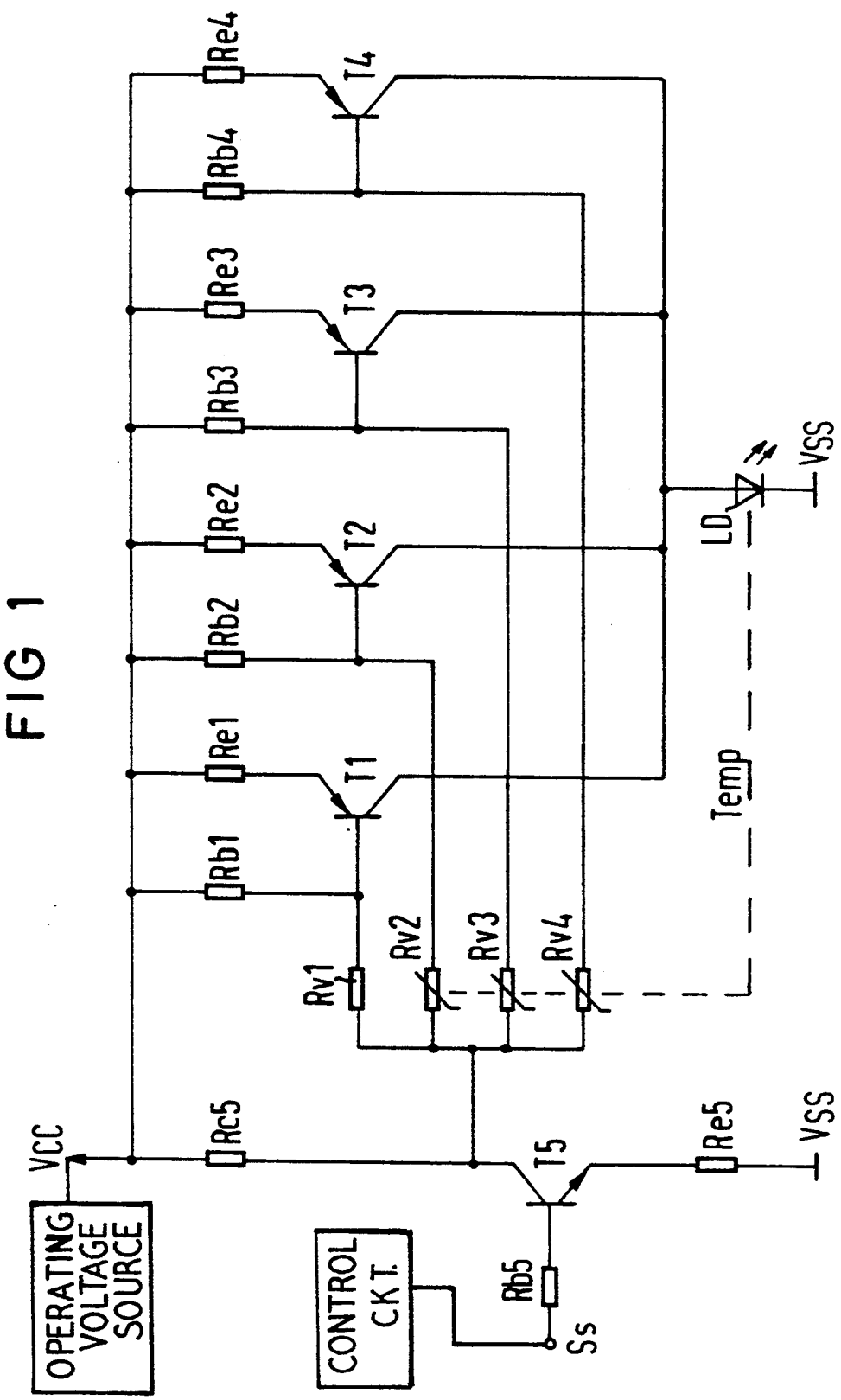
FIG. 1 shows a circuit arrangement according to the invention.

FIG. 1 shows a transistor T1 which is connected with its one main electrode via a resistor Re1 to the terminal Vcc, having the high potential, of an operating voltage source which has the potential difference Vcc-Vss across its terminals. The other main electrode of the transistor T1 is connected to the anode of a laser diode LD, whose cathode is connected to the terminal Vss, having the low potential, of the operating voltage source. Similar series circuits of a respective transistor T2, T3, T4 with a respective resistor Re2, Re3, Re4 are connected in parallel with the series circuit of the transistor T1 with the resistor Re1. The transistors T1, . . . , T4 can be provided by PNP transistors which have the trade name of BC 808 and are connected with their emitter to a respective resistor Re. The base terminals which form the control electrodes of the transistors T1, . . . , T4 are respectively connected via a resistor Rb1, . . . , Rb4 to the terminal Vcc. These base terminals are respectively connected via a resistor Rv1, . . . , Rv4 to the collector of a transistor T5. The resistors Rv2, . . . , Rv4 are temperature-dependent resistors having negative temperature coefficients, which, in the case of an average temperature of the operating temperature range of the laser diode, have the same resistance value as the resistor Rv1. The resistors Rv2, . . . , Rv4 are, as indicated by a dashed line denoted by Temp, arranged relative to the laser diode LD in such a way that the resistors essentially assume the temperature of the laser diode. In other words, a thermal connection is established between the laser diode LD and the temperature dependent resistors Rv2, Rv3, and Rv4.

The collector of the transistor T5 is connected via a resistor Rc5 to the terminal Vcc. The emitter of the transistor T5 is connected via a resistor Re5 to the terminal Vss. The base of the transistor T5 is connected via a resistor Rb5 to the control voltage terminal Ss of the circuit arrangement. The control voltage terminal Ss is fed a control voltage which is supplied by a control circuit (shown as a block element) and can assume voltage values between 0 and 3 V. The transistor T5 remains blocked for low control voltages near 0 V, the result being that its collector assumes the high potential of the terminal Vcc. For rising values of the control voltage, the transistor T5 becomes increasingly low-resistance, it being the case that when the transistor T5 is turned on completely a voltage is set at its collector which is essentially determined by the resistance ratio of the resistor Rc5 and the resistor Re5. If the resistor Rc5 and the resistor Re5 have the same resistance value, when the transistor T5 is turned on completely a voltage value is set at its collector which corresponds approximately to half the operating voltage potential Vcc-Vss. For voltage values at the collector of the transistor T5 which are significantly below the potential of the terminal Vcc, a current flows via a respective resistor Re1, . . . , Re4, the associated emitter/base junction of the respective transistor T1, . . . , T4, the respective resistor Rv1, . . . , Rv4, via the transistor T5 and the resistor Re5 to the terminal Vss having the low potential. The current flow in the respective emitter/base Junctions of the transistors T1, . . . , T4 causes a respective current to flow from the terminal Vcc having the high potential via the respective resistors Re1, . . . , Re4, the emitter/collector junction of the respective transistors T1, . . . , T4 through the laser diode LD to the terminal Vss having the low potential. The power of the optical signal emitted by the laser diode is known to rise with increasing current through the laser diode, an increased current being required to achieve a prescribed power with increasing operating temperature of the laser diode and/or increasing aging of the laser diode. If a resistor fails in the circuit arrangement in accordance with FIG. 1, something which, in accordance with the definition adopted at the beginning, leads to an increase in resistance, this results respectively in a reduced current through the laser diode LD, resulting in a reduction in the power of the optical signal emitted by the laser diode. In the case of a failure of a transistor caused by a short circuit in accordance with the definition adopted at the beginning, the power of the optical signal emitted by the laser diode LD is increased. However, the power increase is limited by the associated resistor Re, which in the present exemplary circuit must be able to permit ¼ of the maximum required current of the laser diode to flow.

In the case of blocking of the transistors T1, . . . , T4, the resistors Rb1, . . . , Rb4, which together with the associated resistors Rv1, . . . , Rv4 ensure the availability of a suitable emitter/base voltage when the associated transistors T1, . . . , T4 are turned on, serve the purpose of an accelerated clearance of charge carriers in the space charge region of the emitter/base junction of a respective transistor T1, . . . , T4, and thus an accelerated blocking of these transistors. It may be pointed out in this connection that, due to the splitting of the total current through the laser diode LD among a plurality of transistors, each individual transistor must carry a correspondingly reduced current, resulting, due to the clearance of the correspondingly lower number of charge carriers in the emitter/collector junction of a respective transistor T1, . . . , T4, in a shortened turnoff time of the transistors, which in turn permits an increased operating frequency of the circuit arrangement.

As already mentioned, in order to achieve a prescribed power of the optical signal emitted by the laser diode LD, an increased current is required through the laser diode LD in the case of an increased operating temperature and/or due to aging effects. If the current flow required for operating the laser diode at the upper operating temperature limit while taking account of advanced aging of the laser diode LD is now permitted through a laser diode in a new condition given an operating temperature at the lower edge of the operating temperature range, an overshooting of the maximum permissible limit value for the power of the optical signal can result therefrom. It is provided in this connection that the resistor Rv1 to a certain extent allows a basic current through the laser diode LD via the transistor T1, while the resistors Rv2, . . . , Rv4 control the current flowing in through the associated transistors T2, . . . , T4 to the laser diode LD in such a way that with rising operating temperature of the laser diode larger values are permitted for the current through the laser diode.

Figure 2:
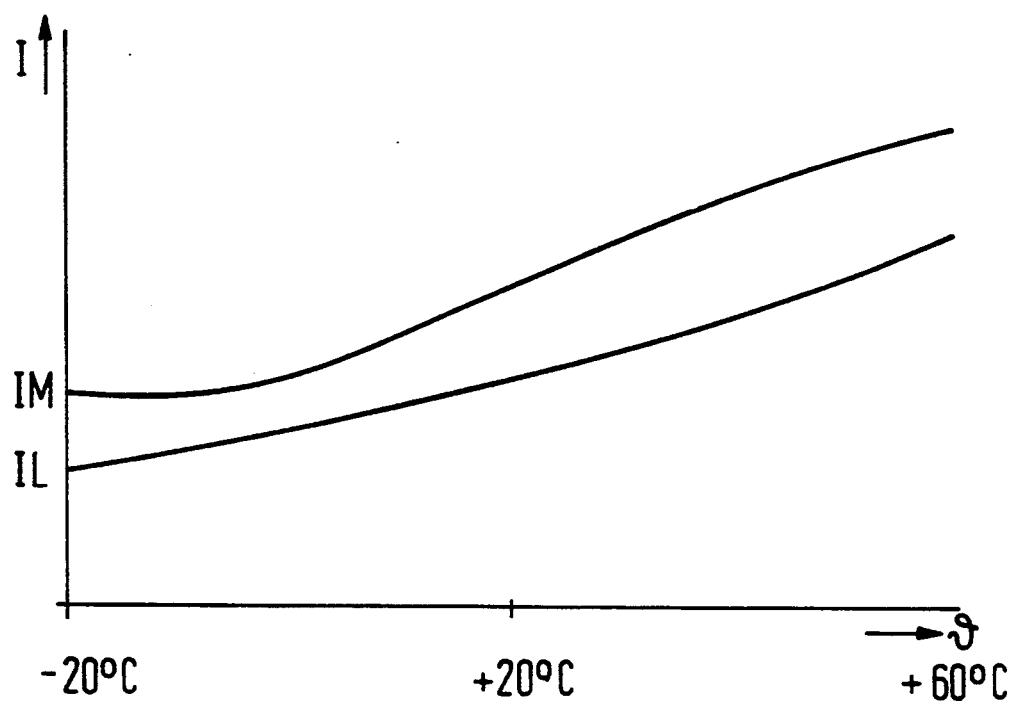
FIG. 2 shows a graphical representation of measured current values determined for the circuit arrangement represented in FIG. 1.

FIG. 2 shows the characteristic, obtained by measurement for a circuit arrangement according to FIG. 1, of a laser current IL required to achieve a prescribed power of the optical signal emitted by the laser diode LD and of a maximum current IM over a temperature range of −20° C. to 60° C. The maximum current curve IM discloses the maximum current through the laser diode LD which is permitted by the circuit arrangement. On the one hand, the maximum current IM has over the entire temperature range a difference relative to the laser current curve IL which is available as a reserve for a current requirement of the laser diode which is increased due to aging; on the other hand, for every temperature of the temperature range, the maximum current IM possibly assumes a value such that the limit value for the maximum permissible power of the optical signal emitted by the laser diode LD is satisfied. The circuit arrangement according to the invention can be dimensioned such that the relationships of maximum current IM to the laser current IL are satisfied even taking account of component tolerances.

Even in the case of a failure of the drive circuit, which can be caused by a failure of the monitor photodiode of the drive circuit, for example, and in the case of which the drive circuit supplies a maximum voltage to the control voltage terminal Ss, the circuit arrangement according to the invention thus ensures that the limit value of the power of the optical signal emitted by the laser diode LD is satisfied over the entire operating temperature range.

Although other modifications and changes may be suggested by those skilled in the art, it is the intention of the inventors to embody within the patent warranted hereon all changes and modifications as reasonably and properly come within the scope of their contribution to the art.

We claim:

1. A circuit arrangement for limiting power of an optical signal emitted by a laser diode, comprising:
   an operating voltage source;
   a laser diode;
   a parallel connection of a plurality of series circuits each of a resistor with main electrodes of a transistor connected to form a circuit with said operating voltage source and said laser diode, and
   drive means for applying a drive signal at least indirectly to control electrodes of all said transistors of said series circuits, said drive means including means for varying said drive signal to a predominant number of said transistors in accordance with changes in temperature of said laser diode and for applying said drive signal directly at their control electrodes, and so that a higher current is supplied through said laser diode for higher temperature values of the laser diode.

2. A circuit arrangement as claimed in claim 1, wherein said drive means includes means for applying a drive signal that is independent of the laser diode temperature to a control electrode of one transistor.

3. A circuit arrangement as claimed in claim 1, wherein said plurality of series circuits comprises four series circuits.

4. A circuit arrangement as claimed in claim 1, wherein each of said resistors of said series circuits have mutually identical resistance values.

5. A circuit arrangement as claimed in claim 1, wherein said means for varying comprises temperature-dependent resistors.

6. A circuit arrangement as claimed in claim 5, wherein said temperature-dependent resistors are in close thermal contact with said laser diode.

7. A circuit arrangement as claimed in claim 5, wherein said temperature-dependent resistors have a negative temperature coefficient.

* * * * *

UNITED STATES PATENT OFFICE
CERTIFICATE OF CORRECTION

Patent No. 5,394,419    Dated Feb. 28, 1995

Inventor(s) Thomas Neuhaus and Klaus Panzer

It is certified that error appears in the above-identified patent and that said Letters Paten. is hereby corrected as shown below:

On the cover sheet of U.S. Patent 5,394,419, item [75] Inventors:, change the first named inventor from "Klaus Neuhaus" to --Thomas Neuhaus-- and delete the third named inventor "Michael Stockmann, Bruckmühl";

item [22] PCT filed:, change "May 35, 1992" to --June 25, 1992--; and item [30] Foreign Application Priority Data, change "Germany" to --Europe--.

Signed and Sealed this

Thirtieth Day of May, 1995

Attest:

BRUCE LEHMAN

*Attesting Officer*    *Commissioner of Patents and Trademarks*